US009345131B2

(12) United States Patent
Peng et al.

(10) Patent No.: US 9,345,131 B2
(45) Date of Patent: May 17, 2016

(54) FLEXIBLE ELECTRONIC DEVICE

(71) Applicant: Industrial Technology Research Institute, Hsinchu (TW)

(72) Inventors: Yi-Cheng Peng, Taoyuan County (TW); Chang-An Ho, Keelung (TW)

(73) Assignee: Industrial Technology Research Institute, HsinChu (TW)

( * ) Notice: Subject to any disclaimer, the term of this patent is extended or adjusted under 35 U.S.C. 154(b) by 0 days.

(21) Appl. No.: 14/162,773

(22) Filed: Jan. 24, 2014

(65) Prior Publication Data

US 2014/0209360 A1 Jul. 31, 2014

Related U.S. Application Data

(60) Provisional application No. 61/756,477, filed on Jan. 25, 2013.

(30) Foreign Application Priority Data

Jan. 13, 2014 (TW) ............................. 103101154 A

(51) Int. Cl.
*H05K 1/02* (2006.01)
*H05K 1/18* (2006.01)
*G09F 9/33* (2006.01)
*G09F 13/22* (2006.01)

(52) U.S. Cl.
CPC *H05K 1/028* (2013.01); *G09F 9/33* (2013.01); *G09F 13/22* (2013.01); *H05K 1/189* (2013.01); *H05K 2201/09063* (2013.01); *H05K 2201/10106* (2013.01); *H05K 2201/10128* (2013.01)

(58) Field of Classification Search
CPC ..... H05K 1/0278; H05K 1/0271; H01L 27/15
USPC ........................................................ 361/681
See application file for complete search history.

(56) References Cited

U.S. PATENT DOCUMENTS 3,822,384 A * 7/1974 Chapron et al. .............. 250/551
4,535,841 A * 8/1985 Kok ............................... 165/185
4,945,398 A * 7/1990 Kurita et al. ................... 257/665

(Continued)

FOREIGN PATENT DOCUMENTS

CN 1687824 10/2005
CN 1780537 5/2006

(Continued)

OTHER PUBLICATIONS

Hoang Nguyen, et al., "Integrating Scientific Workflows and Large Tiled Display Walls: Bridging the Visualization Divide," 40th International Conference on Parallel Processing Workshops (ICPPW), Sep. 13-16, 2011, pp. 308-316.

(Continued)

*Primary Examiner* — Jeremy C Norris
*Assistant Examiner* — Muhammed Azam
(74) *Attorney, Agent, or Firm* — Jianq Chyun IP Office

(57) ABSTRACT

A flexible electronic device including a component portion and at least one folded portion connected to the component portion is provided. The flexible electronic device has a plurality of flexed lines located on the single folded portion and a plurality of stress relief holes, wherein the stress relief holes are separated from each other, and at least a part of the stress relief holes is located on at least one of the flexed lines.

13 Claims, 14 Drawing Sheets

(56) References Cited

U.S. PATENT DOCUMENTS

| | | | |
|---|---|---|---|
| 5,492,842 A * | 2/1996 | Eytcheson et al. | 438/15 |
| 5,805,422 A * | 9/1998 | Otake | H01L 23/4985 257/737 |
| 5,894,409 A * | 4/1999 | Tanaka | 361/749 |
| 6,088,901 A * | 7/2000 | Huber et al. | 29/469.5 |
| 6,688,528 B2 | 2/2004 | Silverbrook | |
| 6,886,751 B2 | 5/2005 | Silverbrook | |
| 7,032,825 B2 | 4/2006 | Silverbrook | |
| 7,128,269 B2 | 10/2006 | Silverbrook | |
| 7,327,346 B2 | 2/2008 | Chung et al. | |
| 7,397,656 B2 * | 7/2008 | Lee et al. | 361/679.27 |
| 7,777,856 B2 | 8/2010 | Silverbrook | |
| 8,149,498 B2 | 4/2012 | Hsieh et al. | |
| 8,305,294 B2 | 11/2012 | Cok et al. | |
| 8,330,347 B2 | 12/2012 | Kee et al. | |
| 8,664,021 B2 * | 3/2014 | Kim et al. | 438/29 |
| 2005/0088830 A1* | 4/2005 | Yumoto et al. | 361/749 |
| 2008/0174944 A1* | 7/2008 | Yeo | 361/681 |
| 2008/0232047 A1* | 9/2008 | Yamada | 361/681 |
| 2010/0277448 A1 | 11/2010 | Okamoto et al. | |
| 2010/0295015 A1* | 11/2010 | Kang | H01L 21/0237 257/13 |
| 2011/0017504 A1* | 1/2011 | Hardin et al. | 174/267 |
| 2012/0300457 A1* | 11/2012 | Jeong et al. | 362/249.01 |
| 2013/0002583 A1* | 1/2013 | Jin et al. | 345/173 |

FOREIGN PATENT DOCUMENTS

| | | |
|---|---|---|
| CN | 102804937 | 11/2012 |
| CN | 102855822 | 1/2013 |
| TW | 200809311 | 2/2008 |
| TW | 201128596 | 8/2011 |
| TW | 201211958 | 3/2012 |
| TW | I370575 | 8/2012 |
| TW | 201243792 | 11/2012 |

OTHER PUBLICATIONS

Yasuo Ebara, "An Experiment on Multipoint Tele-immersive Communication with Tiled Display Wall," International Conference on P2P, Parallel, Grid, Cloud and Internet Computing (3PGCIC), Nov. 4-6, 2010, pp. 421-425.

Yasuo Ebara, "Experiment on Multi-video Transmission with Multipoint Tiled Display Wall," International Conference on P2P, Parallel, Grid, Cloud and Internet Computing (3PGCIC), Oct. 26-28, 2011, pp. 299-302.

Giseok Choe, et al, "Design and Implementation of a Real-time Video Player on Tiled-Display System," 7th IEEE International Conference on Computer and Information Technology, Oct. 16-19, 2007, pp. 621-626.

Yasuo Ebara, "Approaches to Display of Ultra-Resolution Video Streaming by Multi-Transmission on Tiled Display Environment," 15th International Conference on Network-Based Information Systems (NBiS), Sep. 26-28, 2012, pp. 540-545.

Gregory P. Johnson, et al., "DisplayCluster: An Interactive Visualization Environment for Tiled Displays," IEEE International Conference on Cluster Computing, Sep. 24-28, 2012, pp. 239-247.

"Office Action of Taiwan Counterpart Application," issued on Jun. 22, 2015, p. 1-p. 4.

"Office Action of China Counterpart Application", issued on Mar. 4, 2016, p. 1-p. 9, in which the listed references were cited.

* cited by examiner

FLEXIBLE ELECTRONIC DEVICE

CROSS-REFERENCE TO RELATED APPLICATION

This application claims the priority benefits of U.S. provisional application Ser. No. 61/756,477, filed on Jan. 25, 2013 and Taiwan application serial no. 103101154, filed on Jan. 13, 2014. The entirety of each of the above-mentioned patent applications is hereby incorporated by reference herein and made a part of this specification.

TECHNICAL FIELD

The disclosure relates to an electronic component, and a flexible electronic device.

BACKGROUND

Due to a flexible electronic device has features, such as light and thin, flexible, impact resistant, high safety and easy to be carried, the flexible electronic device play a major role in the next generation. Based on the design demand of narrow-edge layout or the signal conduction, the carrier board for the electronic components in a flexible electronic device often gets flexed or bent during assembling.

When the flexible electronic device is bent, the stresses will be concentrated at the bending places of the carrier board which get flexed or bent during assembling so as to lead to the phenomena of stress interference, stress creeping, carrier board's folding, local deformation or destroyed signal contacts (such as an external terminal area). How to take narrow-edge layout and solving the stress concentration into consideration becomes an issue for the technical staff to eagerly concern.

SUMMARY

An embodiment of the disclosure is direct to a flexible electronic device helpful to the design demand of narrow-edge layout and able to reduce stress concentration.

In one embodiment, the flexible electronic device of the disclosure includes a component portion and at least one folded portion connected to the component portion, wherein the flexible electronic device has a plurality of flexed lines located on the single folded portion and a plurality of stress relief holes, the stress relief holes are separated from each other, and at least a part of the stress relief holes is located on at least one of the flexed lines.

In one embodiment, the flexible electronic device of the disclosure includes a component portion and at least one folded portion connected to the component portion, wherein the flexible electronic device has a plurality of flexed lines located on the single folded portion, the folded portion includes a reflexed portion located at the edge of the folded portion, and the reflexed portion is jointed to the component portion.

Based on the depiction above, in the embodiment of the disclosure, the flexible electronic device may meet the design demand of narrow-edge layout even no-edge layout. Further, by disposing a plurality of stress relief holes on the folded portion, the extent of stress concentration can be reduced so as to thereby ensure the quality of the flexible electronic device and increase the lifetime thereof.

Several exemplary embodiments accompanied with figures are described in detail below to further describe the disclosure in details.

DETAILED DESCRIPTION OF DISCLOSED EMBODIMENTS

Figure 1:
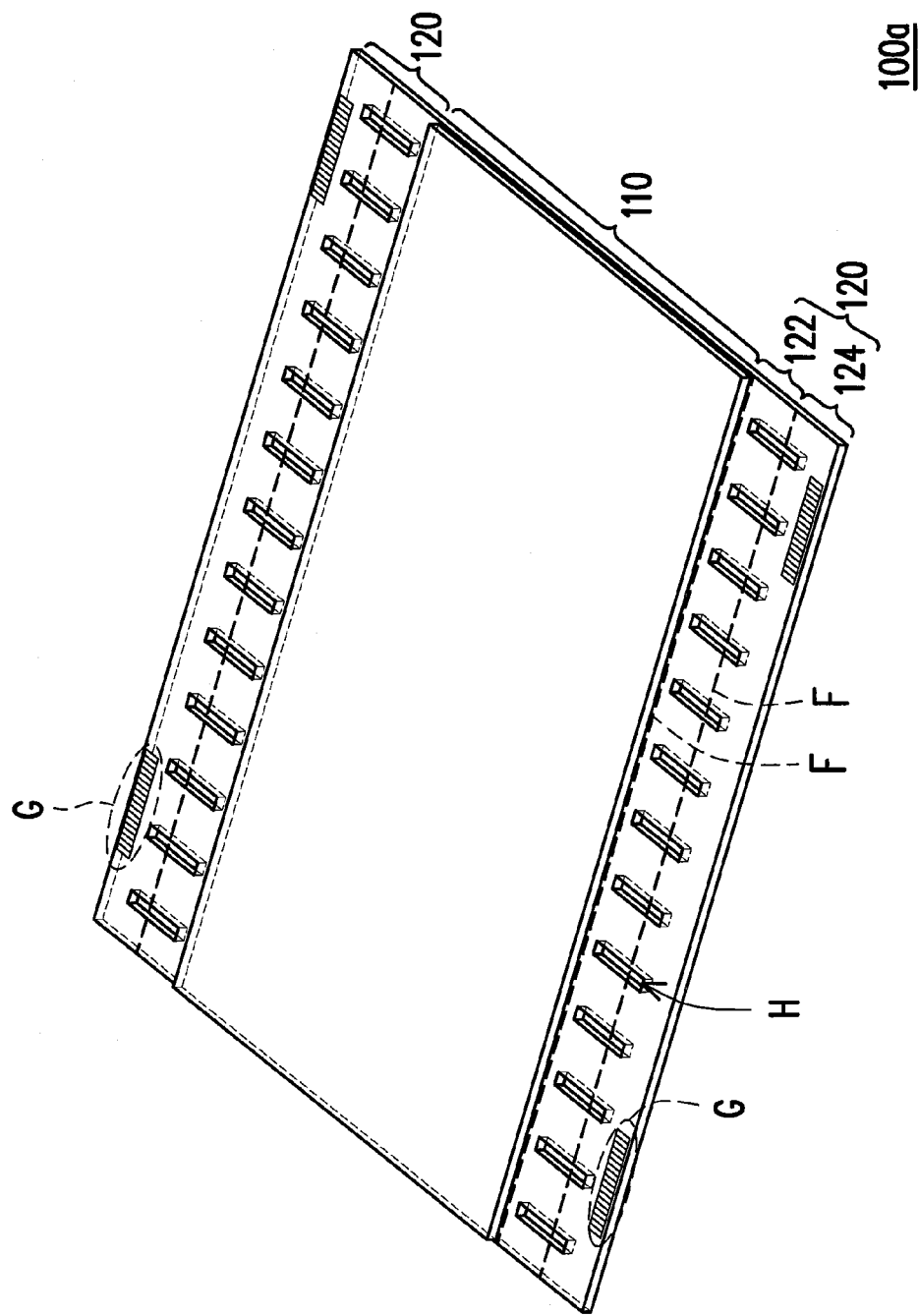
FIG. 1 is a schematic exploded diagram of a flexible electronic device according to an embodiment of the disclosure.
Figure 2:
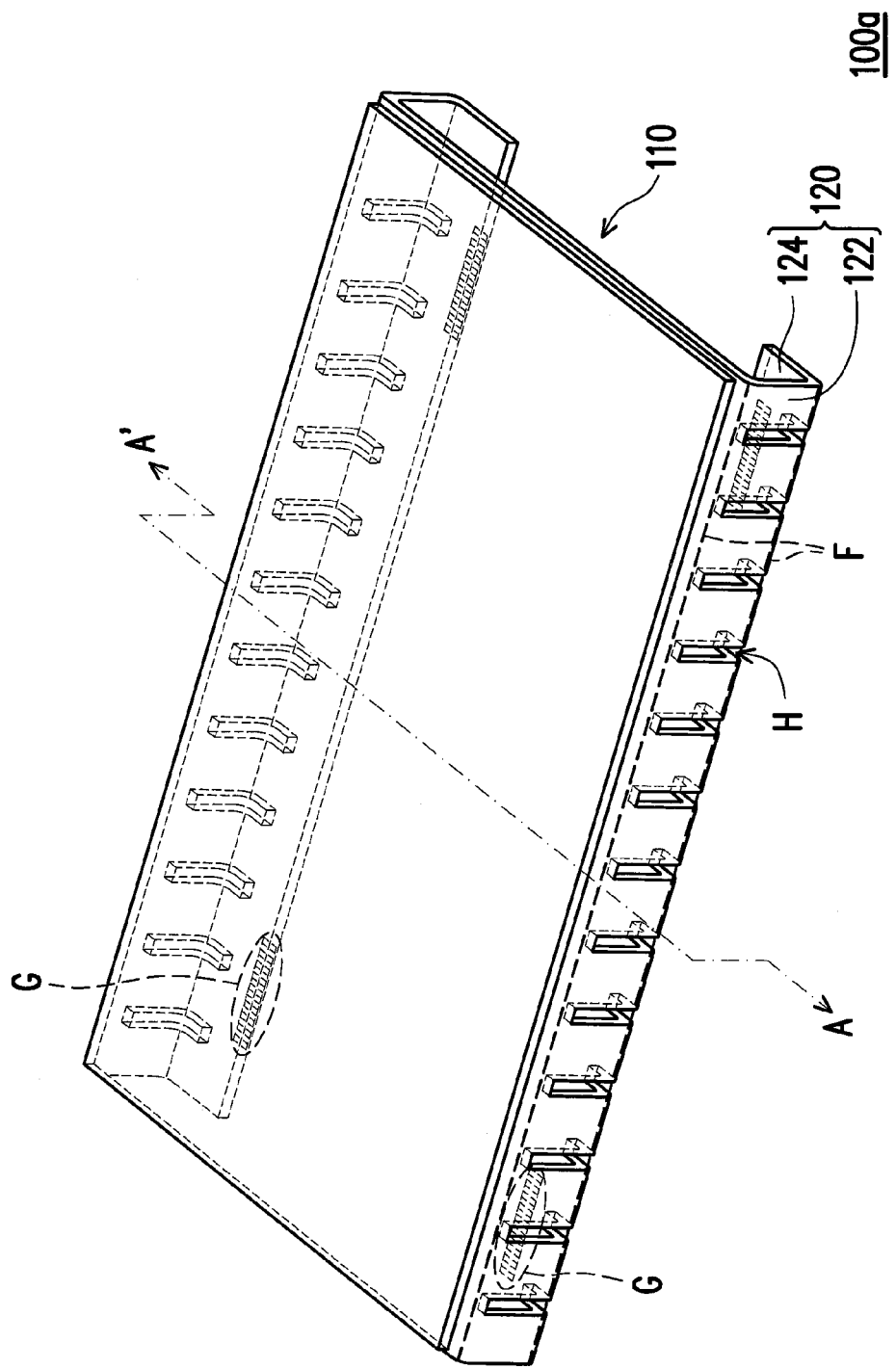
FIG. 2 is a three-dimensional side-view diagram of the flexible electronic device of FIG. 1.

FIG. 1 is a schematic exploded diagram of a flexible electronic device according to an embodiment of the disclosure and FIG. 2 is a three-dimensional side-view diagram of the flexible electronic device of FIG. 1. Referring to FIGS. 1 and 2, a flexible electronic device 100a includes a component portion 110 and at least one folded portion 120, in which the folded portion 120 is connected to the component portion 110.

Figure 3A:
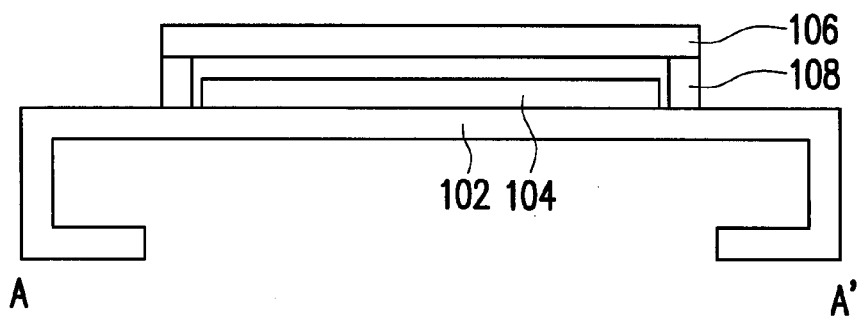
FIG. 3A is a cross-sectional diagram along line A-A' in FIG. 2.
Figure 3B:
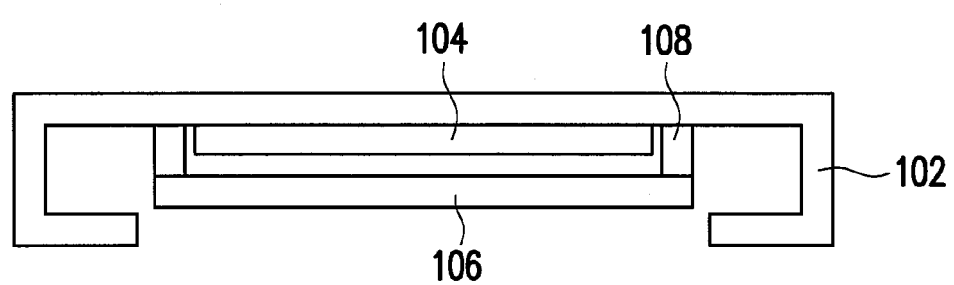
FIG. 3B is a cross-sectional diagram of a flexible electronic device according to another embodiment of the disclosure.
Figure 3C:
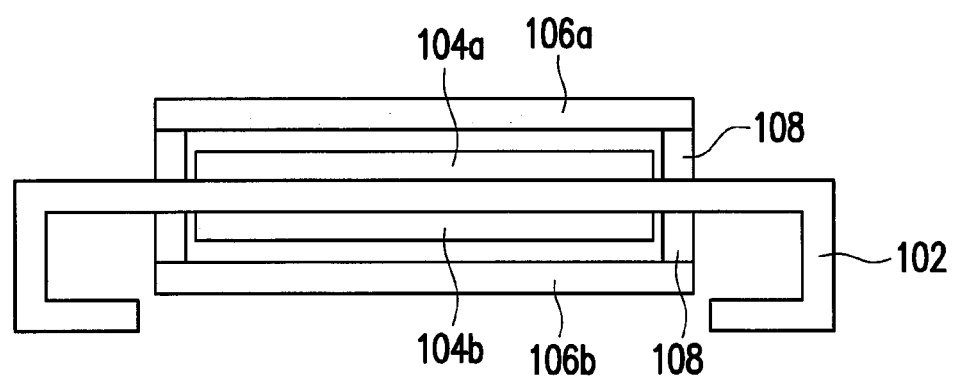
FIG. 3C is a cross-sectional diagram of a flexible electronic device according to yet another embodiment of the disclosure.

The flexible electronic device 100a is, for example, formed by disposing electronic components on a flexible carrier board and the disclosure does not particularly limit the type of the flexible electronic device 100a, for example, the flexible electronic device 100a can be a flexible display device. At the time, the component portion 110 can be an organic light emitting diode (OLED), an electrophoretic component, an electrowetting display component or a display component of other types. Taking the OLED as an example of the component portion 110, the component portion 110 includes a carrier board 102, an OLED 104 and a cover 106, as shown in FIG. 3A. The OLED 104 is disposed on the carrier board 102 and the cover 106 is disposed on the carrier board 102 and covers the OLED 104. The area of the carrier board 102 is substantially greater than the area of the cover 106, in which the area of the carrier board 102 uncovered by the cover 106 comprises the folded portion 120. FIG. 3A illustrates an top emitting OLED 104, which the disclosure is not limited thereto. In other embodiments, the component portion 110 can be a bottom emitting OLED 104 as well, as shown in FIG. 3B. Or, the component portion 110 can be a double emitting OLED, which is, for example, formed by disposing two OLEDs 104a and 104b at the two sides of the carrier board 102 and covered respectively by two covers 106a and 106b, as shown by FIG. 3C.

The carrier board 102 can have any shapes and is composed of a material with a certain flexibility, for example, plastic, flexible thermoelectric film, flexible thin glass, flexible glass fiberboard, paper, textiles, rubber and resin. The plastic includes polyimide (PI), polyethylene terephthalate (PET) or polyethylene naphthalate (PEN). The cover 106 can have any shapes and is composed of a material with a certain flexibility, for example, plastic, flexible thin glass, flexible glass fiberboard, rubber and resin. The plastic includes polyimide (PI), polyethylene terephthalate (PET) or polyethylene naphthalate (PEN). The cover 106, preferably, has a certain transparency and can be laminated onto the carrier board 102 by using hot bonding, vacuum lamination, roller lamination or glue lamination.

The OLED 104 may include a plurality of scan lines, a plurality of data lines and a plurality of pixel units, in which each of the pixel units is electrically connected to a corresponding scan line or a corresponding data line. The pixel unit includes, for example, a first electrode, a light emitting material layer and a second electrode, in which the light emitting material layer is located between the first electrode and the second electrode. The pixel unit can use a circuit structure of two transistors with a capacitor (i.e., a so-called 2T1C circuit structure) to drive the above-mentioned OLED 104, which the disclosure is not limited thereto. The OLED 104 can be driven by using other different circuit. The flexible electronic device 100a can include a plurality of signal lines disposed at the folded portion 120, in which a part of the signal lines is electrically connected to the aforementioned scan lines and data lines. The signal lines extend onto the folded portion 120 to form at least one external terminal region G.

The flexible electronic device 100a includes two folded portions 120 connected to the component portion 110, and the two folded portions 120 are located at the two opposite sides of the component portion 110, which the disclosure is not limited thereto. In other embodiments, the flexible electronic device 100a can include one or three more folded portions 120 and the folded portions 120 can be located at anyone side, any two sides or any three more sides of the component portion 110.

Taking one folded portion 120 as an example, the flexible electronic device 100a has a plurality of flexed lines F located on the folded portion 120. In the embodiment, the folded portion 120 has two flexed lines F thereon which can be parallel or not parallel to each other. The folded portion 120 is bent along the two flexed lines F to form a side-edge portion 122 and a reflexed portion 124, and the reflexed portion 124 is located at the edge of the folded portion 120, in which the component portion 110, the side-edge portion 122 and the reflexed portion 124 are not coplanar. As shown in FIG. 1, a process step can be conducted along a flexed line F closer to the component portion 110 so that the component portion 110 and the partial folded portion 120 form an included angle therebetween (for example, 90°), followed by conducting another process step along the other flexed line F so that the partial folded portion 120 is divided into the side-edge portion 122 and the reflexed portion 124 along this flexed line F. The reflexed portion 124 is located at the back of the component portion 110. The external terminal region G is located on the reflexed portion 124 and faces the direction far away from the component portion 110. In other words, the joining direction of the external terminal region G gets changed after the process. At the time, the external terminal region G can be even directly jointed to a printed circuit board or a flexible electronic substrate without through a flexible circuit connection board (for example, a flexible printed circuit board) so as to save an operation of joining the flexible circuit connection board. In addition, in the embodiment of the disclosure, the partial carrier board 102 is folded to form the folded portion 120, which can reduce the frame width of the flexible electronic device 100a to realize a design of narrow-edge layout or no-edge layout.

In other embodiments, it can dispose the electronic component of other types on the carrier board 102 to form the component portion 110, in which the method of disposing the electronic component on the carrier board 102 or connecting the other circuit structures to the external terminal region G includes: connection by connectors, anisotropic conductive paste bonding (ACP), anisotropic conductive film bonding (ACF), soldering, ball grid array packaging and surface mount technology.

Figure 4:
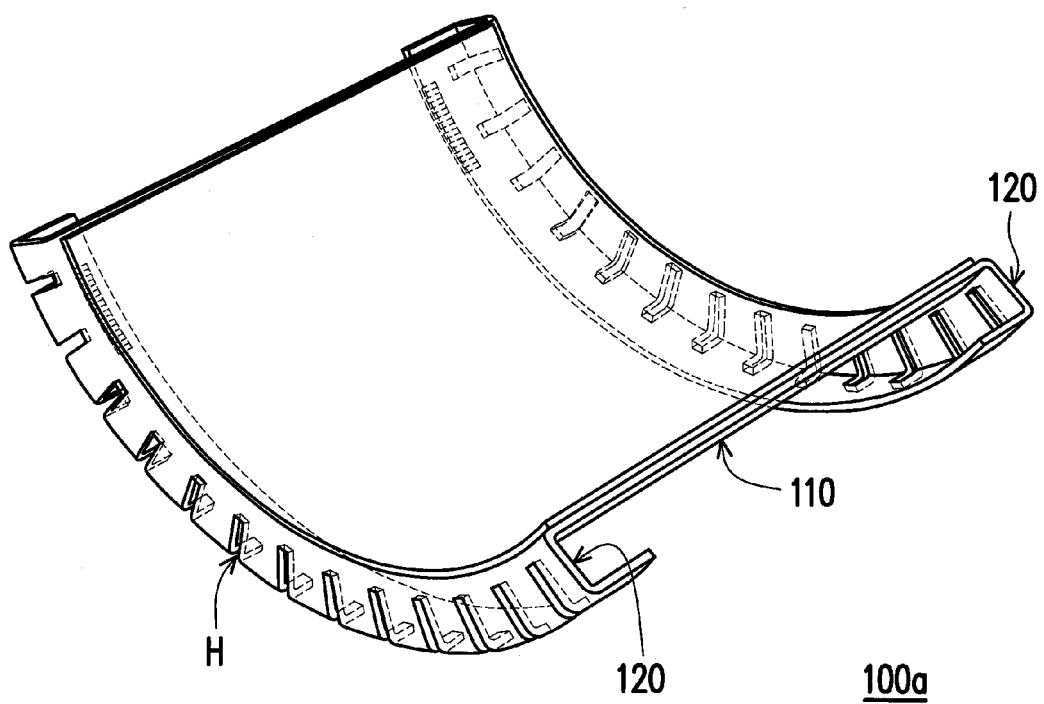
FIG. 4 is a diagram showing the bent structure of the flexible electronic device of the embodiment.

The flexible electronic device 100a has a plurality of stress relief holes H located on the folded portion 120, which are separated from each other and located on at least one of the flexed lines F. FIG. 4 is a diagram showing the bent structure of the flexible electronic device of the embodiment. Referring to FIG. 4, when the flexible electronic device 100a is bent, larger stress concentrations easily occur at the place where the bending is bigger, while the folded portion 120 easily suffers a larger stress. Disposing the stress relief holes H is helpful to reduce stress interference, stress creeping, substrate wrinkle, local deformation, destroyed signal contact or other adverse situations. The shape of the stress relief holes H can be any shape such as round, square, trapezoidal and triangular. The opening area of the stress relief hole H is, for example, over 0.25 $\mu m^2$ and the type of the stress relief holes H can be a through hole going through the folded portion 120 or a blind hole without going through the folded portion 120.

The shaping method of the flexible electronic device 100a includes die punching, die cutting, knife cutting, laser etching, laser cutting, chemical etching, plasma etching or exposure and development for shaping.

Figure 5:
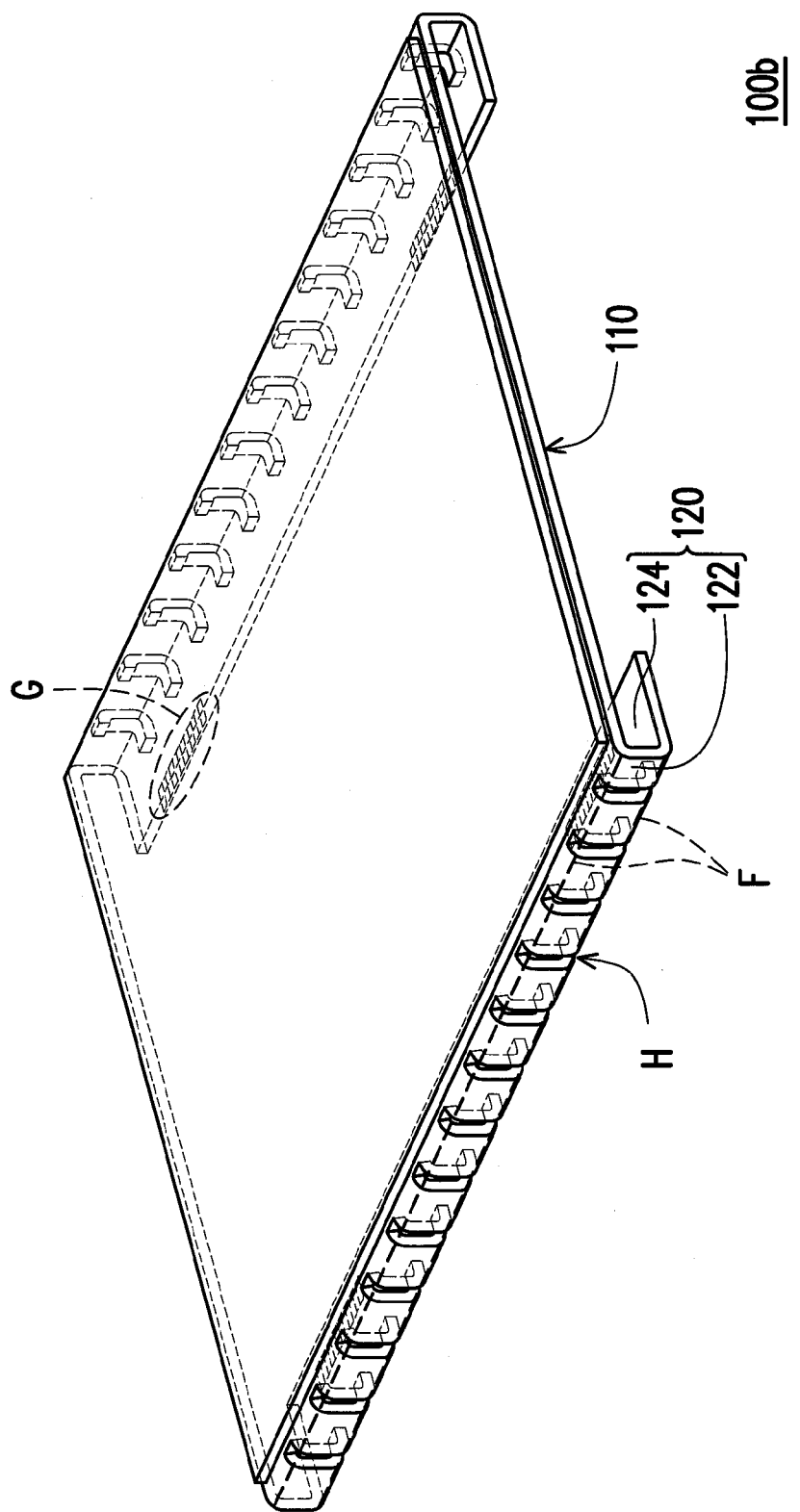
FIG. 5 is a three-dimensional side-view diagram of a flexible electronic device according to another embodiment of the disclosure.

In follows, other embodiments are explained to describe in details the flexible electronic device of the disclosure, wherein the same reference numbers are used in the drawings and the description to refer to the same or like parts but the same technical contents are omitted. FIG. 5 is a three-dimensional side-view diagram of a flexible electronic device according to another embodiment of the disclosure. Referring to FIG. 5, the structure of a flexible electronic device 100b herein is similar to the flexible electronic device 100a in FIG. 2 except that at least a part of the stress relief holes H of the flexible electronic device 100b pass through both two flexed lines F. The stress relief holes H can, all of them or a part thereof, pass through the two flexed lines F.

Figure 6:
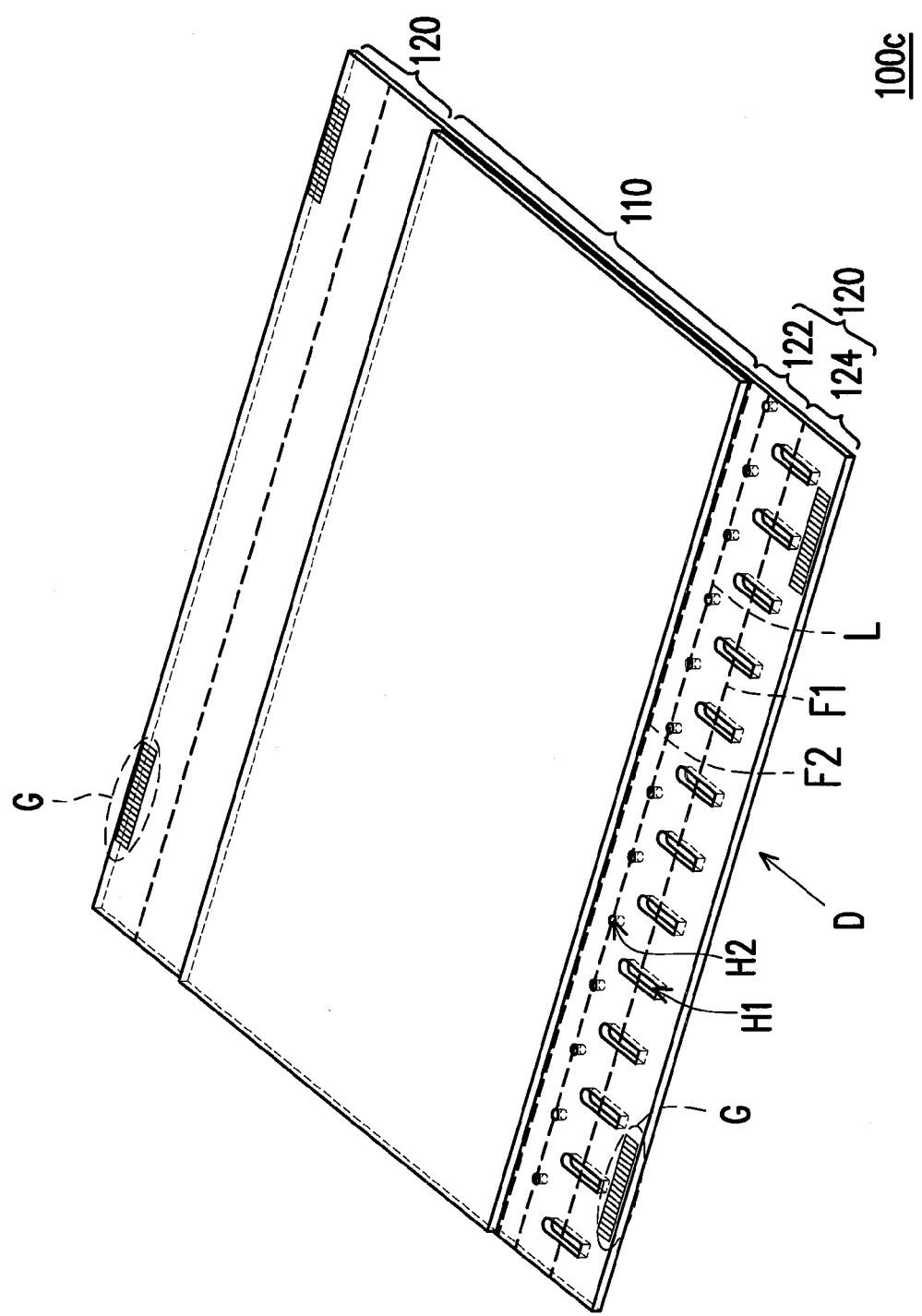
FIG. 6 is a schematic exploded diagram of a flexible electronic device according to another embodiment of the disclosure.
Figure 7:
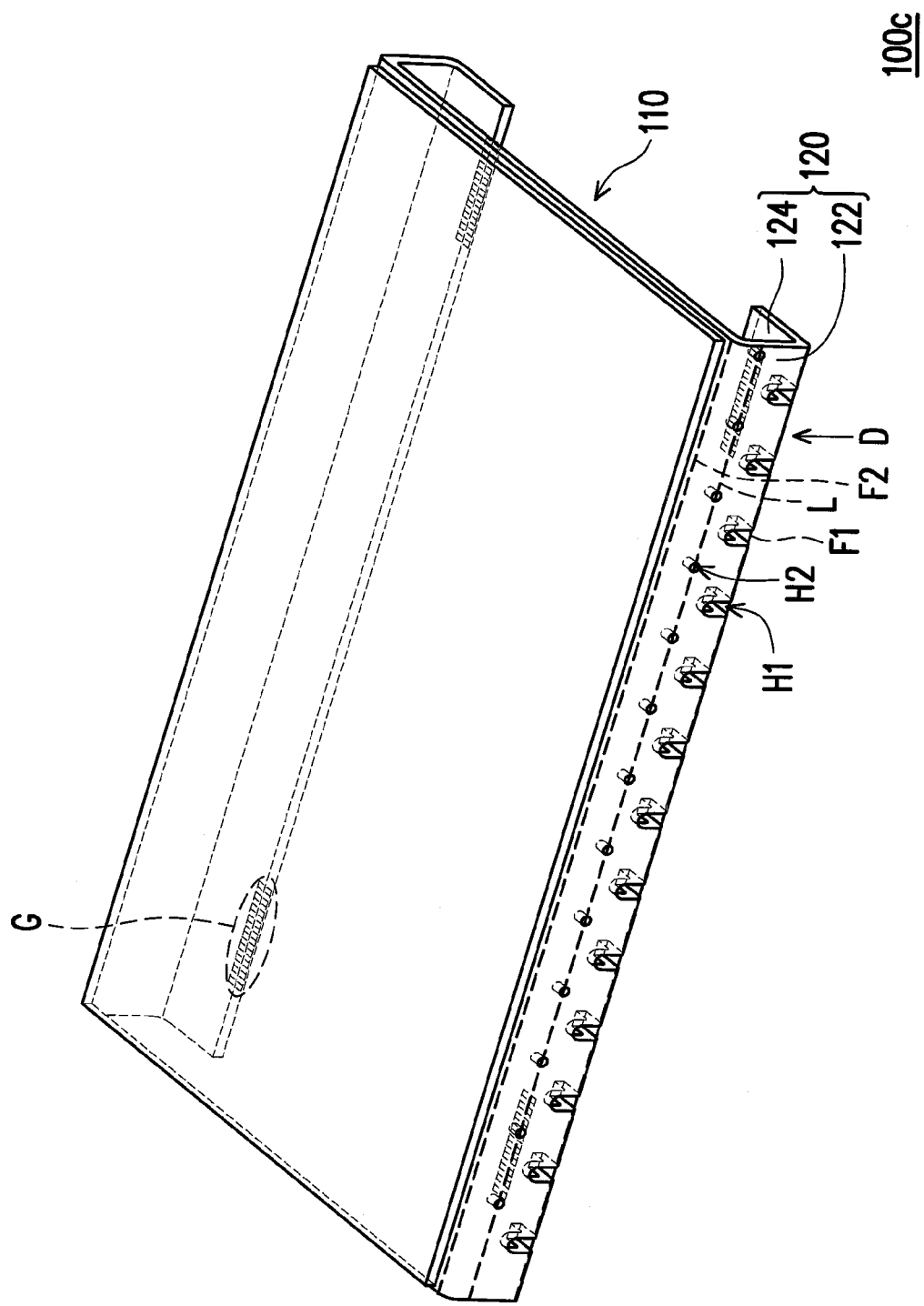
FIG. 7 is a three-dimensional side-view diagram of the flexible electronic device of FIG. 6.

FIG. 6 is a schematic exploded diagram of a flexible electronic device according to another embodiment of the disclosure and FIG. 7 is a three-dimensional side-view diagram of the flexible electronic device of FIG. 6. Referring to FIGS. 6 and 7, the structure of a flexible electronic device 100c herein is similar to the flexible electronic device 100a in FIG. 2 except that the flexible electronic device 100c has a plurality of stress relief holes H1 separated from each other and a plurality of stress relief holes H2 separated from each other. Each of the stress relief holes H1 is corresponding to one of the stress relief holes H2, wherein the stress relief hole H1 and the corresponding stress relief hole H2 are separated from each other. The stress relief holes H1 are located on one of the flexed lines F1 without extending onto the other flexed line F2. The stress relief holes H2 are not located on the flexed line F1 and the flexed line F2, and the stress relief holes H2 are arranged along a straight-line L. The stress relief holes H1 and the stress relief holes H2 are not arranged along an arrangement direction D and the arrangement direction D is perpendicular to the straight-line L and the flexed line F1. In other words, the stress relief holes H1 and the stress relief holes H2 will not simultaneously located on the arrangement direction D perpendicular to the flexed line F1 so that the stress relief holes H1 and the stress relief holes H2 present a dislocation arrangement to increase the structure strength of the folded portion 120, which the disclosure is not limited thereto.

Figure 8:
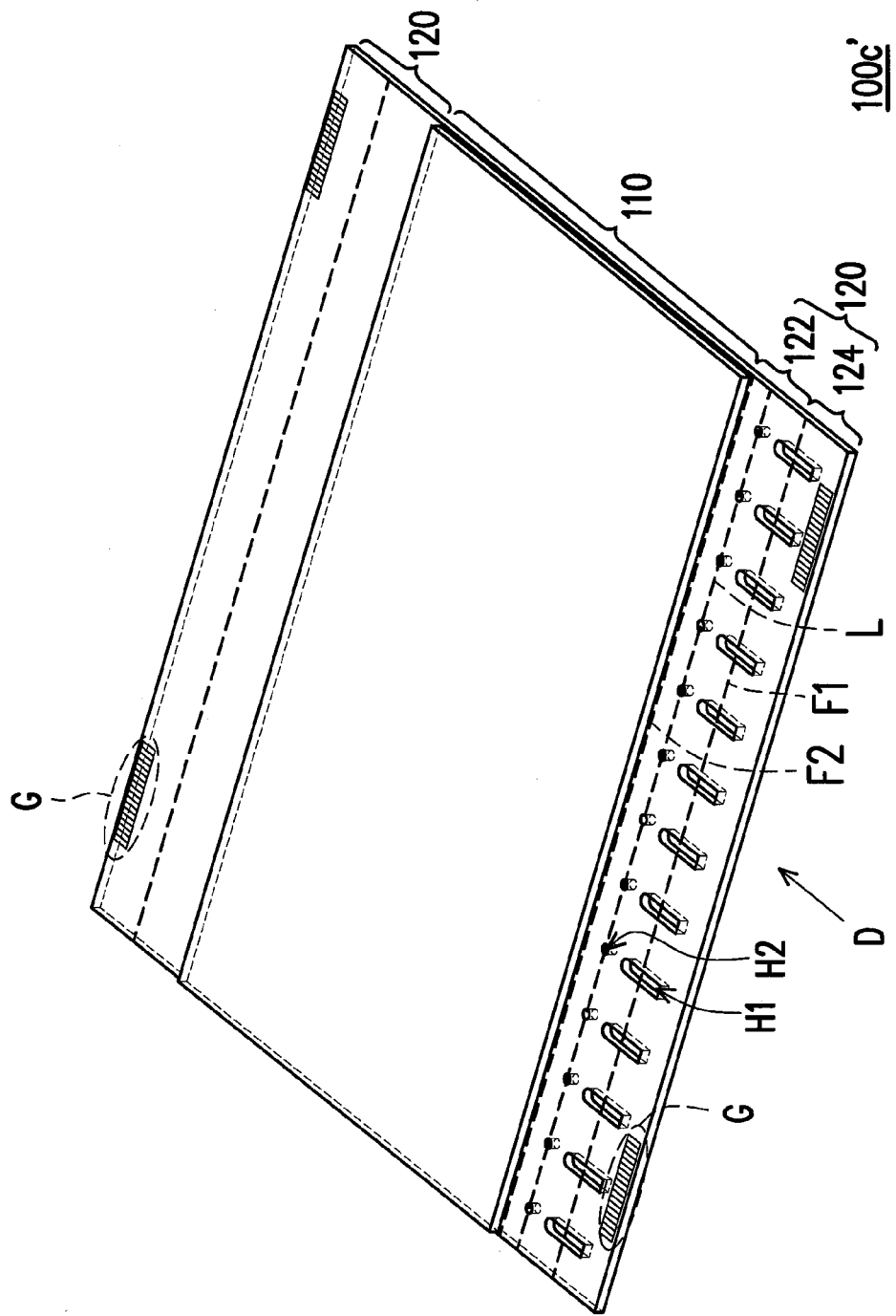
FIG. 8 is a schematic exploded diagram of a flexible electronic device according to another embodiment of the disclosure.

FIG. 8 is a schematic exploded diagram of a flexible electronic device according to another embodiment of the disclosure. The structure of a flexible electronic device 100c' herein is similar to the flexible electronic device 100c in FIG. 6 except that in the flexible electronic device 100c' of FIG. 8, the stress relief holes H1 and the stress relief holes H2 are arranged along a arrangement direction D. The arrangement direction D is perpendicular to the straight-line L and the flexed line F1. In other words, the stress relief holes H1 and the stress relief holes H2 are simultaneously located on the arrangement direction D perpendicular to the flexed line F1 so that the stress relief holes H1 and the stress relief holes H2 are aligned with each other along the arrangement direction D.

Figure 9:
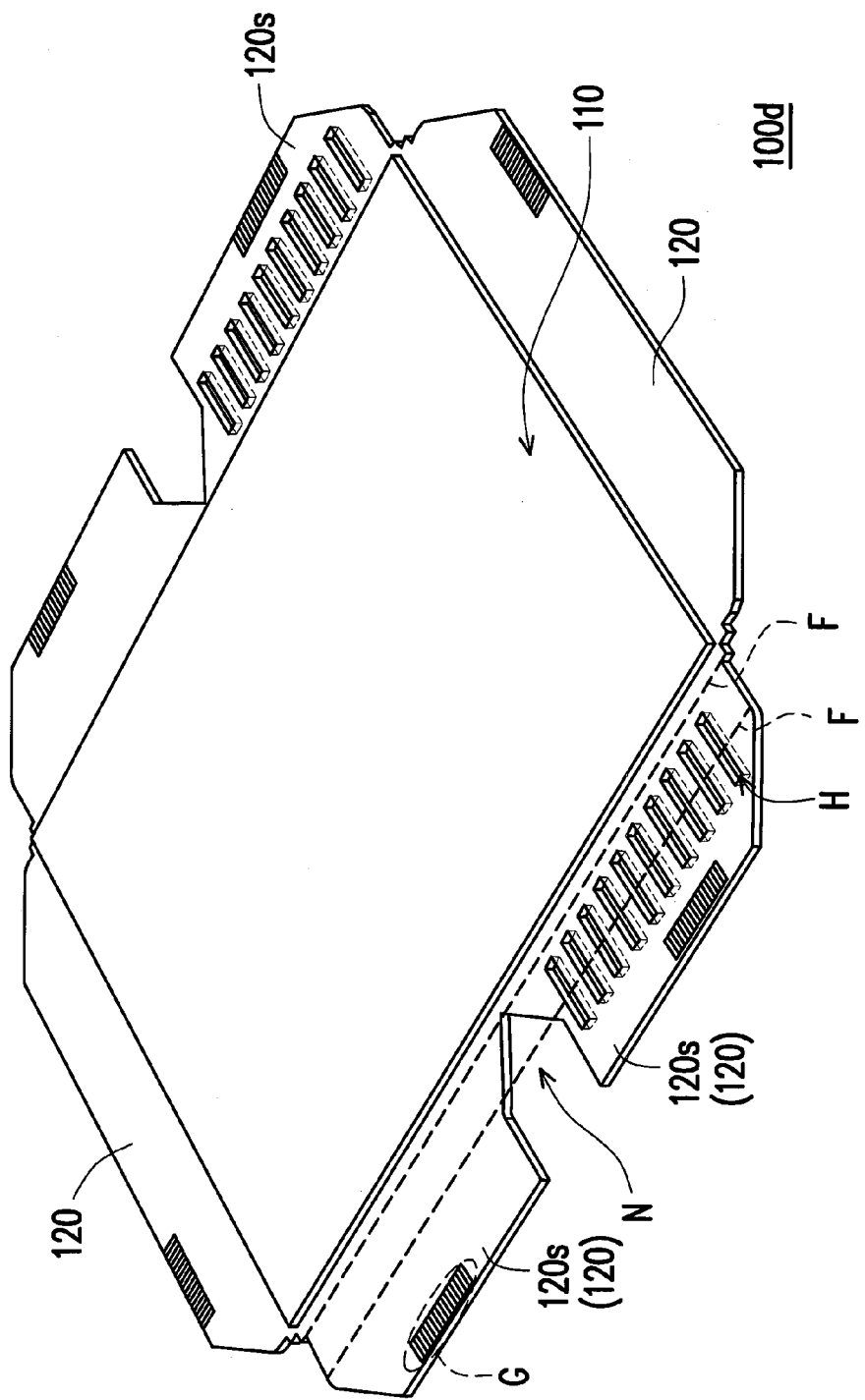
FIG. 9 is a schematic exploded diagram of a flexible electronic device according to yet another embodiment of the disclosure.
Figure 10:
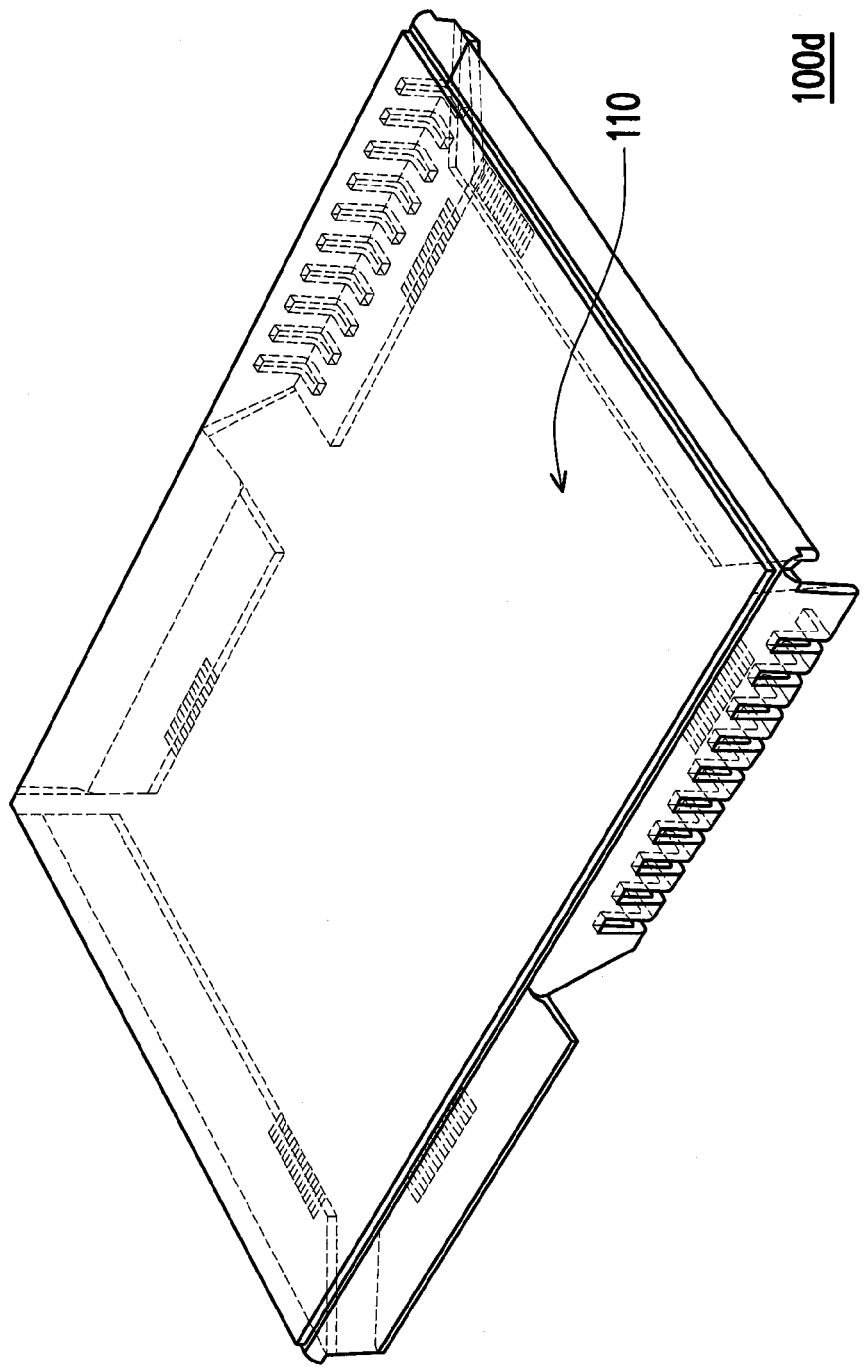
FIG. 10 is a three-dimensional side-view diagram of the flexible electronic device of FIG. 9.

FIG. 9 is a schematic exploded diagram of a flexible electronic device according to yet another embodiment of the disclosure and FIG. 10 is a three-dimensional side-view diagram of the flexible electronic device of FIG. 9. Referring to FIGS. 9 and 10, the structure of a flexible electronic device 100d herein is similar to the flexible electronic device 100a in FIG. 2 except that the flexible electronic device 100d has a notch N. The notch N extends from the edge of the flexible electronic device 100d towards the component portion 110 to divide the folded portion 120 into a plurality of sub-areas 120s, wherein the stress relief holes H are located on at least one of the sub-areas 120s. In the embodiment, the stress relief holes H are located only on one of the sub-areas 120s, which the disclosure is not limited thereto. In fact, the stress relief holes H can be located on all of the sub-areas 120s. When the flexible electronic device 100d is bent, the notch N makes the stresses not concentrated at the area where the notch N is located, which helps to reduce stress interference, stress creeping, substrate wrinkle, local deformation, destroyed signal contact or other adverse situations.

Figure 11:
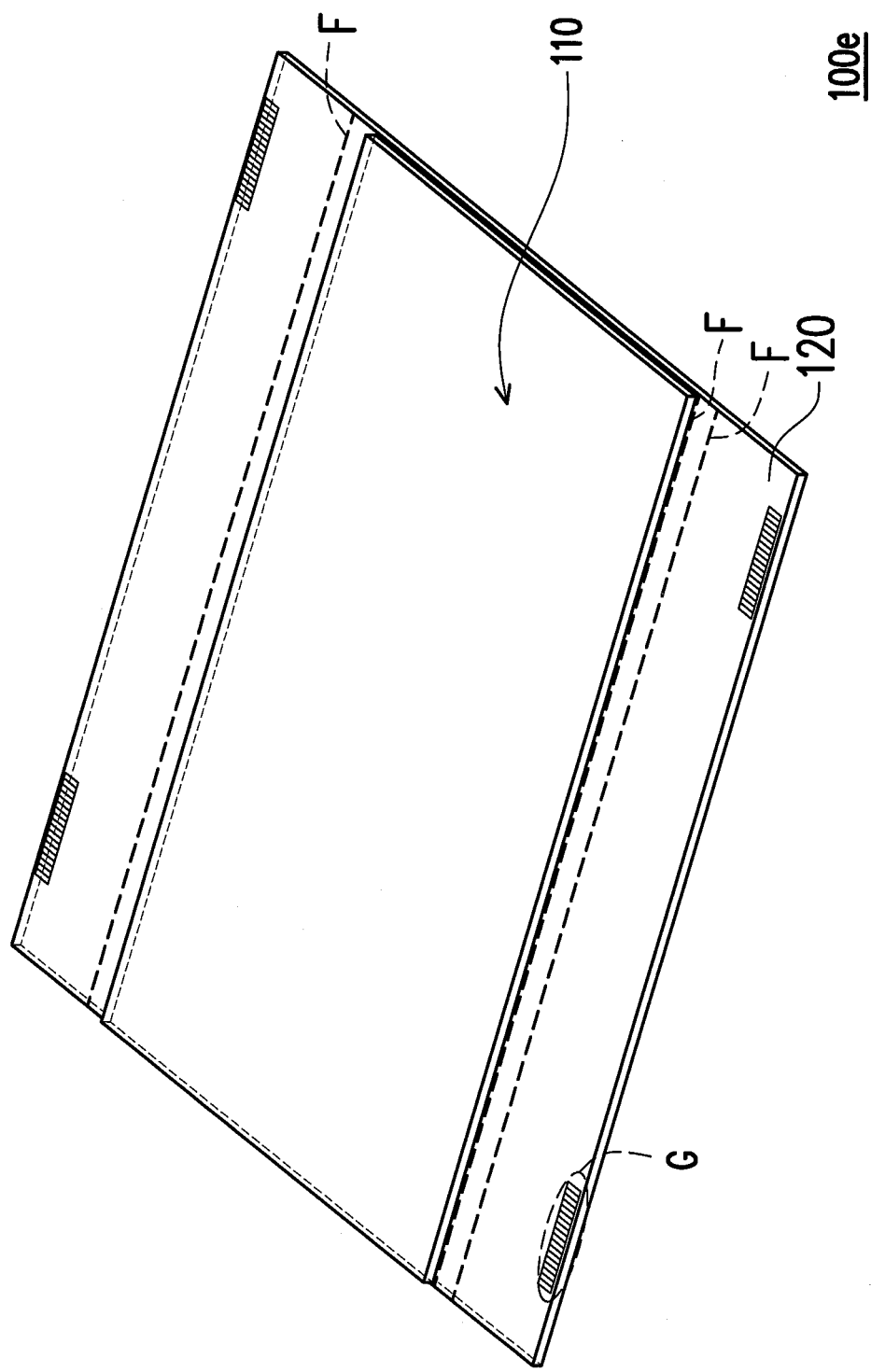
FIG. 11 is a schematic exploded diagram of a flexible electronic device according to yet another embodiment of the disclosure.
Figure 12:
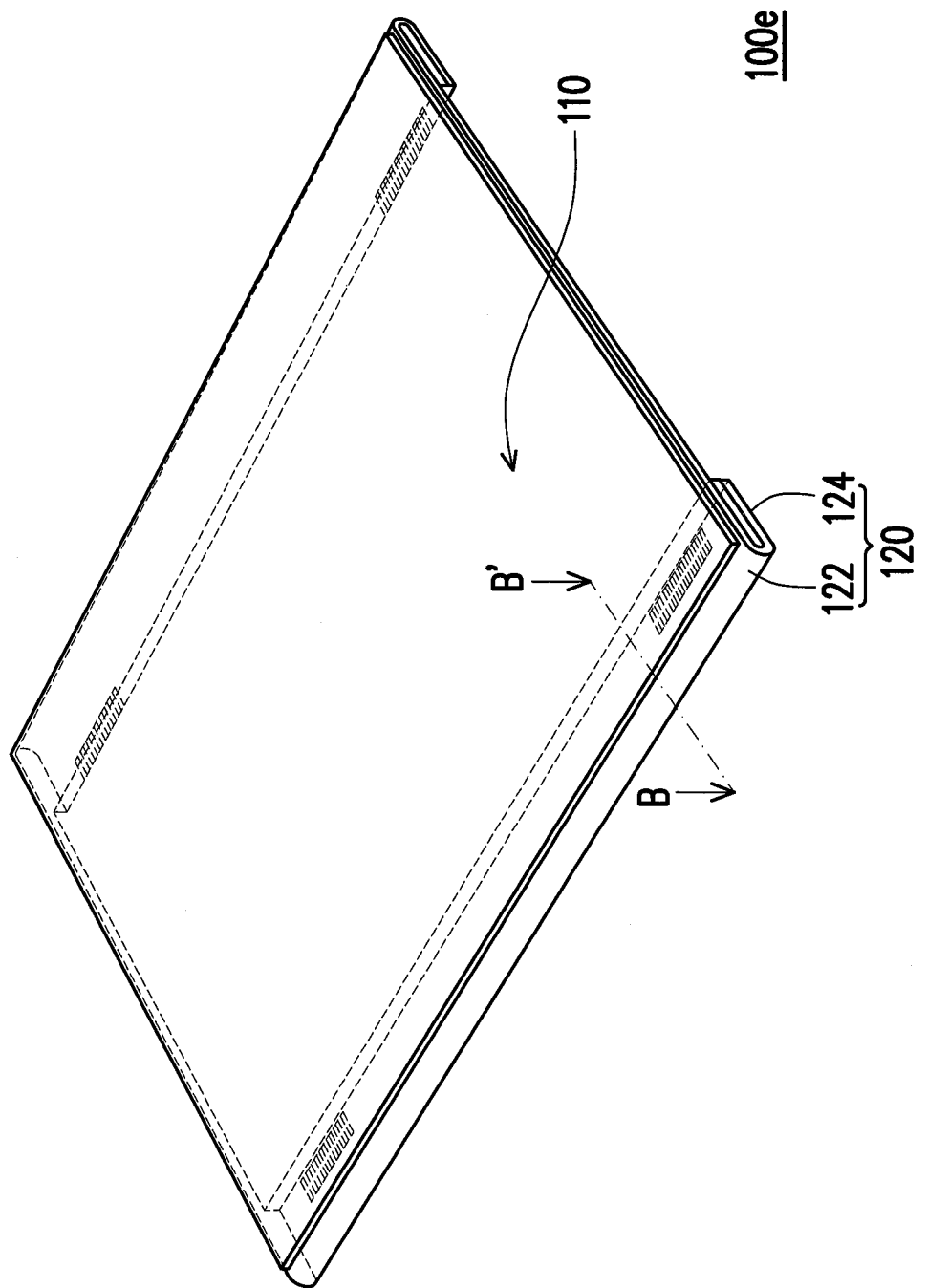
FIG. 12 is a three-dimensional side-view diagram of the flexible electronic device of FIG. 11.
Figure 13:
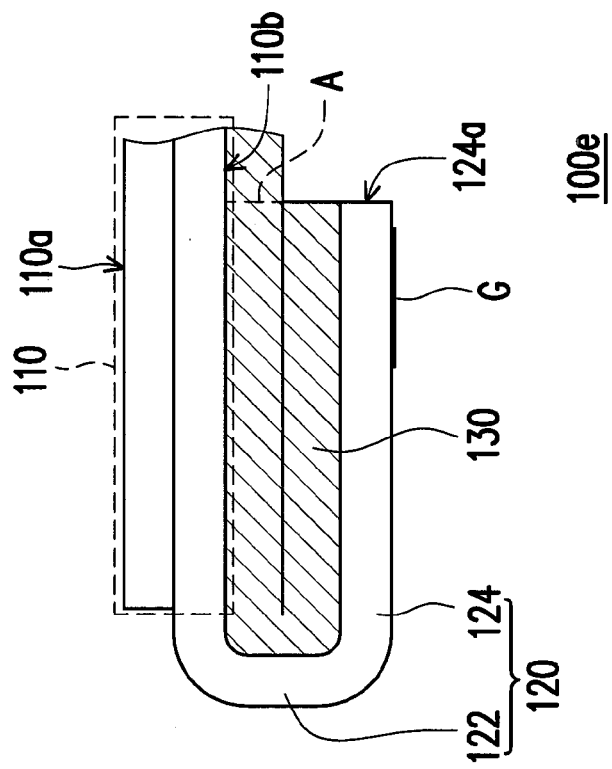
FIG. 13 is a cross-sectional diagram along line B-B' in FIG. 12.

FIG. 11 is a schematic exploded diagram of a flexible electronic device according to yet another embodiment of the disclosure, FIG. 12 is a three-dimensional side-view diagram of the flexible electronic device of FIG. 11 and FIG. 13 is a cross-sectional diagram along line B-B' in FIG. 12. Referring to FIGS. 11-13, the structure of a flexible electronic device 100e herein is similar to the flexible electronic device 100a in FIG. 2 except that the reflexed portion 124 of the folded portion 120 is jointed to the component portion 110, and the component portion 110 has a front-surface 110a and a back-surface 110b, in which the reflexed portion 124 is jointed to the back-surface 110b of the component portion 110. The reflexed portion 124 and the component portion 110 can be jointed to each other through a bonding layer 130. The bonding layer 130 is located between the reflexed portion 124 and the component portion 110, and the bonding layer 130 entirely overlays the back-surface 110b of the component portion 110. Thus, the flexible electronic device 100e can be jointed onto other devices through the bonding layer 130 on the back-surface 110b of the component portion 110, which the disclosure is not limited thereto. In other embodiments, the edge of the bonding layer 130 (referring to the dotted line A in FIG. 13) can be aligned to the edge 124a of the reflexed portion 124. The bonding layer 130 can be made of, for example, a glue material, a thermoplastic resin or other suitable bonding materials, wherein the thermoplastic resin is, for example, thermoplastic polyimide.

Figure 14:
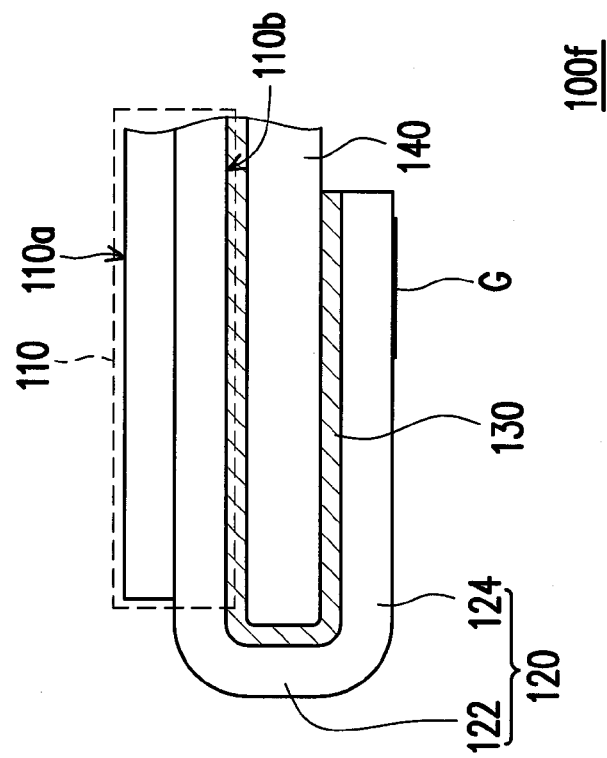
FIG. 14 is a partial cross-sectional diagram of a flexible electronic device according to yet another embodiment of the disclosure.

FIG. 14 is a partial cross-sectional diagram of a flexible electronic device according to yet another embodiment of the disclosure. Referring to FIG. 14, the structure of a flexible electronic device 100f herein is similar to the flexible electronic device 100e in FIG. 13 except that the flexible electronic device 100f further includes a substrate 140, which is disposed on the back-surface 110b of the component portion 110 and located between the reflexed portion 124 and the component portion 110. The reflexed portion 124, the component portion 110 and the substrate 140 are jointed together through the bonding layer 130. The substrate 140 is made of, for example, a flexible material able to provide an appropriate thickness. The folded portion 120 can be bent for wrapping along the edge and the side-wall of the substrate 140 so as to form the reflexed portion 124. At the time, the folded portion 120 is not easy to wrinkle, crack or other adverse situations due to over-bending.

Figure 15:
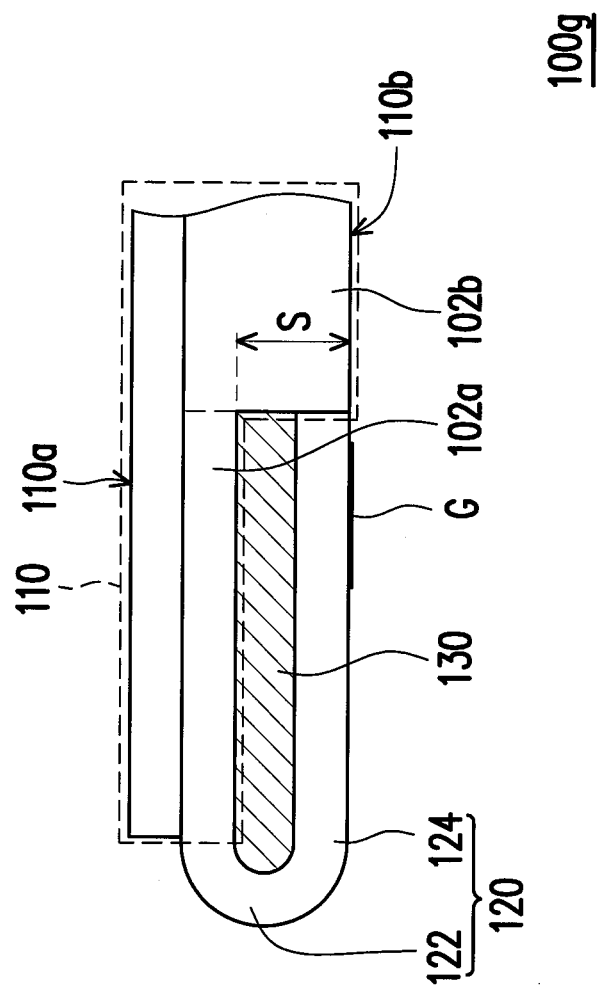
FIG. 15 is a partial cross-sectional diagram of a flexible electronic device according to yet another embodiment of the disclosure.

FIG. 15 is a partial cross-sectional diagram of a flexible electronic device according to yet another embodiment of the disclosure. Referring to FIG. 15, the structure of a flexible electronic device 100g herein is similar to the flexible electronic device 100e in FIG. 13 except that the carrier board of the component portion 110 of the flexible electronic device 100g includes a first portion 102a and a second portion 102b. The thicknesses of the first portion 102a and the second portion 102b are different from each other to form a height step S at the boundary of the first portion 102a and the second portion 102b. The thickness of the first portion 102a is less than the thickness of the second portion 102b and the thickness of the first portion 102a is roughly equal to the thickness of the folded portion 120. The first portion 102a is adjacent to the folded portion 120 and connected between the second portion 102b and the folded portion 120. When the reflexed portion 124 of the folded portion 120 gets reflexed, a space able to accommodate the reflexed portion 124 is provided since the thickness of the first portion 102a is thinner than the second portion 102b. The reflexed portion 124 and the first portion 102a are jointed together through the bonding layer 130. The thicknesses of the first portion 102a and the reflexed portion 124 after joining are roughly the same as the thickness of the second portion 102b. Thus, the flexible electronic device 100g is not easy to wrinkle, crack or other adverse situations due to over-bending. The thickness difference between the first portion 102a and the second portion 102b can be realized by different etching extents, which the disclosure is not limited thereto. In other embodiments, the thickness difference between the first portion 102a and the second portion 102b can be realized by using other appropriate means.

In summary, the flexible electronic device of the disclosure includes a folded portion to meet the design demand of narrow-edge layout even no-edge layout. Further, by disposing a plurality of stress relief holes on the folded portion, the extent of stress concentration produced when the flexible electronic device is bent can be reduced so as to ensure the quality of the flexible electronic device and increase the lifetime thereof.

It will be apparent to those skilled in the art that various modifications and variations can be made to the structure of the disclosed embodiments without departing from the scope or spirit of the disclosure. In view of the foregoing, it is intended that the disclosure covers modifications and variations of this disclosure and they fall within the scope of the following claims and their equivalents.

What is claimed is:

1. A flexible electronic device, comprising a component portion and at least one folded portion connected to the component portion, wherein the flexible electronic device has a plurality of flexed lines located on one of the at least one folded portion and a plurality of stress relief holes, the stress relief holes are separated from each other, and at least a part of the stress relief holes is located on at least one of the flexed lines, and at least a part of the stress relief holes simultaneously passes through two flexed lines.

2. The flexible electronic device as claimed in claim 1, wherein the flexed lines are parallel to each other.

3. The flexible electronic device as claimed in claim 1, wherein the flexible electronic device has at least one notch, the notch extends from edge of the flexible electronic device towards the component portion to divide the folded portion into a plurality of sub-areas, wherein the stress relief holes are located at least on one of the sub-areas.

4. The flexible electronic device as claimed in claim 3, wherein the stress relief holes are located only on one of the sub-areas.

5. The flexible electronic device as claimed in claim 1, wherein the folded portion and the component portion comprises:
　a carrier board;
　an organic light emitting device, disposed on the carrier board; and
　a cover, disposed on the carrier board and covering the organic light emitting device, wherein area of the carrier board not covered by the cover is the folded portion.

6. A flexible electronic device, comprising a component portion and at least one folded portion connected to the component portion, wherein the flexible electronic device has a plurality of flexed lines located on the single folded portion, wherein the folded portion comprises a reflexed portion located at an edge of the folded portion, and the reflexed portion is jointed to the component portion, wherein the component portion comprises a carrier board, the carrier board comprises a first portion and a second portion, and thickness of the first portion is less than thickness of the second portion.

7. The flexible electronic device as claimed in claim 6, wherein the reflexed portion is jointed to the component portion through a bonding layer.

8. The flexible electronic device as claimed in claim 7, wherein the bonding layer is disposed at an area where the reflexed portion and the component portion are overlapped with each other.

9. The flexible electronic device as claimed in claim 7, wherein the bonding layer overlays a part of the component portion.

10. The flexible electronic device as claimed in claim 7, wherein the bonding layer entirely overlays the component portion.

11. The flexible electronic device as claimed in claim 6, further comprising a substrate disposed on the component portion and located between the reflexed portion and the component portion, wherein the reflexed portion, the component portion and the substrate are joined together through a bonding layer.

12. The flexible electronic device as claimed in claim 6, wherein the first portion is adjacent to the folded portion and connected between the second portion and the folded portion, and the reflexed portion and the first portion are jointed together through a bonding layer.

13. The flexible electronic device as claimed in claim 12, wherein thickness of the first portion is the same as thickness of the folded portion.

* * * * *